United States Patent
Tseng et al.

(10) Patent No.: US 11,715,715 B2
(45) Date of Patent: Aug. 1, 2023

(54) METAL BUMP STRUCTURE AND MANUFACTURING METHOD THEREOF AND DRIVING SUBSTRATE

(71) Applicant: Unimicron Technology Corp., Taoyuan (TW)

(72) Inventors: Tzyy-Jang Tseng, Taoyuan (TW); Ming-Ru Chen, Hsinchu (TW); Cheng-Chung Lo, Hsinchu County (TW); Chin-Sheng Wang, Taoyuan (TW); Wen-Sen Tang, Taichung (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 17/200,922

(22) Filed: Mar. 15, 2021

(65) Prior Publication Data

US 2022/0238471 A1 Jul. 28, 2022

(30) Foreign Application Priority Data

Jan. 28, 2021 (TW) .................... 110103177

(51) Int. Cl.
*H01L 23/00* (2006.01)
*H01L 25/075* (2006.01)
(Continued)

(52) U.S. Cl.
CPC .............. *H01L 24/13* (2013.01); *H01L 24/03* (2013.01); *H01L 24/05* (2013.01); *H01L 24/11* (2013.01);
(Continued)

(58) Field of Classification Search
CPC ......... H01L 24/13; H01L 24/03; H01L 24/05; H01L 24/11; H01L 25/0753;
(Continued)

(56) References Cited

U.S. PATENT DOCUMENTS 7,112,522 B1 * 9/2006 Tsao .................. H01L 24/03
257/E23.021
2011/0254161 A1 * 10/2011 Hu .................. H01L 23/49816
257/E23.021

(Continued)

FOREIGN PATENT DOCUMENTS

| TW | 201044527 | 12/2010 |
|---|---|---|
| TW | 201944504 | 11/2019 |
| TW | I711192 | 11/2020 |

*Primary Examiner* — Douglas W Owens
(74) *Attorney, Agent, or Firm* — JCIPRNET

(57) ABSTRACT

A manufacturing method of a metal bump structure is provided. A driving base is provided. At least one pad and an insulating layer are formed on the driving base. The pad is formed on an arrangement surface of the driving base and has an upper surface. The insulating layer covers the arrangement surface of the driving base and the pad, and exposes a part of the upper surface of the pad. A patterned metal layer is formed on the upper surface of the pad exposed by the insulating layer, and extends to cover a part of the insulating layer. An electro-less plating process is performed to form at least one metal bump on the patterned metal layer. A first extension direction of the metal bump is perpendicular to a second extension direction of the driving base.

14 Claims, 5 Drawing Sheets

(51) Int. Cl.
*H01L 27/12* (2006.01)
*H01L 33/62* (2010.01)

(52) U.S. Cl.
CPC ...... *H01L 25/0753* (2013.01); *H01L 27/1214* (2013.01); *H01L 33/62* (2013.01); *H01L 2224/03312* (2013.01); *H01L 2224/03552* (2013.01); *H01L 2224/0401* (2013.01); *H01L 2224/0518* (2013.01); *H01L 2224/05082* (2013.01); *H01L 2224/05124* (2013.01); *H01L 2224/05139* (2013.01); *H01L 2224/05144* (2013.01); *H01L 2224/05147* (2013.01); *H01L 2224/05164* (2013.01); *H01L 2224/05166* (2013.01); *H01L 2224/05171* (2013.01); *H01L 2224/05193* (2013.01); *H01L 2224/11464* (2013.01); *H01L 2224/13013* (2013.01); *H01L 2224/13014* (2013.01); *H01L 2224/13111* (2013.01); *H01L 2224/13144* (2013.01); *H01L 2224/13147* (2013.01); *H01L 2224/13155* (2013.01); *H01L 2924/12041* (2013.01); *H01L 2924/1426* (2013.01); *H01L 2933/0066* (2013.01)

(58) Field of Classification Search
CPC ............... H01L 27/1214; H01L 33/62; H01L 2224/03312; H01L 2224/03552; H01L 2224/0401; H01L 2224/05082; H01L 2224/05124; H01L 2224/05139; H01L 2224/05144; H01L 2224/05147; H01L 2224/05164; H01L 2224/05166; H01L 2224/05171; H01L 2224/0518; H01L 2224/05193; H01L 2224/11464; H01L 2224/13013; H01L 2224/13014; H01L 2224/13111; H01L 2224/13144; H01L 2224/13147; H01L 2224/13155; H01L 2924/12041; H01L 2924/1426; H01L 2933/0066

See application file for complete search history.

(56) References Cited

U.S. PATENT DOCUMENTS

| | | | |
|---|---|---|---|
| 2013/0256871 A1* | 10/2013 | Topacio | H01L 23/3171 257/E21.511 |
| 2014/0322863 A1* | 10/2014 | Lin | H01L 24/17 438/107 |
| 2017/0358546 A1* | 12/2017 | Shim | H01L 24/02 |
| 2018/0190606 A1* | 7/2018 | Williamson | H01L 24/05 |
| 2019/0385964 A1* | 12/2019 | Choi | H01L 24/06 |

* cited by examiner

METAL BUMP STRUCTURE AND MANUFACTURING METHOD THEREOF AND DRIVING SUBSTRATE

CROSS-REFERENCE TO RELATED APPLICATION

This application claims the priority benefit of Taiwan application serial no. 110103177, filed on Jan. 28, 2021. The entirety of the above-mentioned patent application is hereby incorporated by reference herein and made a part of this specification.

BACKGROUND

Technical Field

The disclosure relates to a bump structure and the manufacturing method thereof and a substrate, and in particular relates to a metal bump structure and the manufacturing method thereof and a driving substrate having the metal bump structure.

Description of Related Art

At present, active-matrix driving (AM Driving) micro light emitting diode displays (micro LED display) mostly use thin film transistor (TFT) glass substrates to drive the light emitting diodes (LEDs). However, because of thin firm process, the metal conductors on the thin film transistors and the Indium Tin Oxide (ITO) in the pixel area are only nanoscale. When the LEDs or surface mount devices (SMDs) are to be solder-bonded on the ITO conductive layer, they cannot form a reliable intermetallic compound (IMC) so as to be bonded together. In order to solve the above-mentioned problems, electroplating is currently implemented to form a thick copper layer on the ITO conductive layer. However, the process of electroplating thick copper is lengthy and complicated, which not only increases manufacturings cost but also causes environmental pollution because it is a wet process.

SUMMARY OF THE INVENTION

The disclosure provides a metal bump structure and the manufacturing method thereof, which has simple manufacturing process, low cost, and does not cause environmental pollution.

The disclosure further provides a driving substrate, including the metal bump structure, which has better structural reliability.

A manufacturing method of a metal bump structure is provided includes the following steps. A driving base is provided. At least one pad and an insulating layer are already formed on the driving base. The at least one pad is formed on an arrangement surface of the driving base and has an upper surface. The insulating layer covers the arrangement surface of the driving base and covers the at least one pad, and exposes a part of the upper surface of the at least one pad. A patterned metal layer is formed on the upper surface of the at least one pad exposed by the insulating layer, and extends to cover a part of the insulating layer. An electro-less plating process is performed so as to form at least one metal bump on the patterned metal layer. A first extension direction of the at least one metal bump is perpendicular to a second extension direction of the driving base.

In an embodiment of the disclosure, the steps of forming the patterned metal layer include forming a catalyst layer on the insulating layer and on the upper surface of the at least one pad exposed by the insulating layer, and performing an activation process and a patterning process on the catalyst layer so as to form the patterned metal layer.

In an embodiment of the disclosure, a method of forming the catalyst layer includes an inkjet printing method.

In an embodiment of the disclosure, a material of the catalyst layer includes nano-palladium (Nano-Pd), or any nano metal that can reduce chemical copper, such as nano-gold or nano-silver.

In an embodiment of the disclosure, the activation process includes a laser activation process or a heating process.

In an embodiment of the disclosure, a material of the patterned metal layer includes palladium, gold, or silver.

In an embodiment of the disclosure, a material of the metal bump includes copper, gold, tin or nickel.

In an embodiment of the disclosure, a cross-sectional shape of the metal bump includes a circle-like shape or a rectangular shape.

In an embodiment of the disclosure, a material of the at least one pad includes Indium Tin Oxide (ITO), or any sputtered metal layer such as titanium, copper, molybdenum, aluminum or chromium.

In an embodiment of the disclosure, a thickness of the metal bump is between 1 micrometer and 10 micrometers.

A metal bump structure of the disclosure is disposed on a driving base. A pad and an insulating layer are disposed on the driving base. The pad is disposed on an arrangement surface of the driving base and has an upper surface. The insulating layer covers the arrangement surface of the driving base and covers the pad, and exposes a part of the upper surface of the pad. The metal bump structure includes a patterned metal layer and a metal bump. The patterned metal layer is formed on the upper surface of the pad exposed by the insulating layer, and extends to cover a part of the insulating layer. The metal bump is disposed on the patterned metal layer, where a first extension direction of the metal bump is perpendicular to a second extension direction of the driving base.

In an embodiment of the disclosure, a material of the patterned metal layer includes palladium, or any nano metal that can reduce chemical copper, such as gold or silver.

In an embodiment of the disclosure, a material of the metal bump includes copper, gold, tin or nickel.

In an embodiment of the disclosure, a cross-sectional shape of the metal bump includes a circle-like shape or a rectangular shape.

In an embodiment of the disclosure, a thickness of the metal bump is between 1 micrometer and 10 micrometers.

A driving substrate of the disclosure includes a driving base, at least one active element, at least one pad, an insulating layer, and at least one metal bump structure. The driving base includes an arrangement surface. The at least one active element is disposed on the arrangement surface of the driving base. The at least one pad is disposed on the arrangement surface of driving base and has an upper surface. The insulating layer covers the arrangement surface of the driving base, covers the at least one active element, and covers the at least one pad, and the insulating layer exposes a part of the upper surface of the at least one pad. The metal bump structure includes a patterned metal layer and a metal bump. The patterned metal layer is disposed on the upper surface of the at least one pad exposed by the insulating layer, and extends to cover a part of the insulating layer. The metal bump is disposed on the patterned metal layer. A first extension direction of the metal bump is perpendicular to a second extension direction of the driving base.

In an embodiment of the disclosure, a material of the patterned metal layer includes palladium, and a material of the metal bump includes copper, gold, tin or nickel.

In an embodiment of the disclosure, a cross-sectional shape of the metal bump includes a circle-like shape or a rectangular shape.

In an embodiment of the disclosure, a thickness of the metal bump is between 1 micrometer and 10 micrometers.

In an embodiment of the disclosure, a material of the at least one pad includes ITO, or any sputtered metal layer such as titanium, copper, molybdenum, aluminum or chromium.

Based on the above, according to the manufacturing method of the metal bump structure of the disclosure, the metal bump is formed through an electro-less plating process. Compared with the existing wet electroplating process to form metal bumps, dry process is adopted in the disclosure so as to form metal bumps, which has simple manufacturing process, low cost, and does not cause environmental pollution. In addition, with the driving substrate of the metal bump structure of the disclosure, when the light-emitting element is subsequently bonded, good intermetallic compound can be formed between the light-emitting element and the metal bump structure, which has better structural reliability.

In order to make the above-mentioned features of the disclosure more obvious and understandable, the embodiments are specifically described below in conjunction with the accompanying drawings for detailed description as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
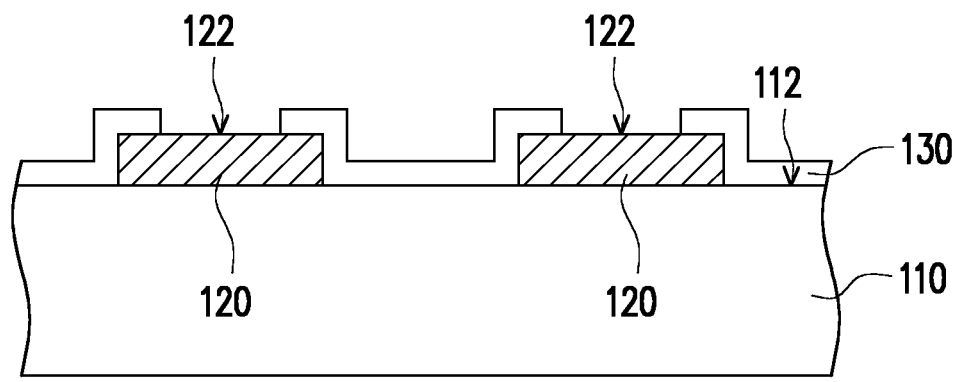
FIG. 1A to FIG. 1D are schematic cross-sectional views of a manufacturing method of a metal bump structure according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

FIG. 1A to FIG. 1D are schematic cross-sectional views of a manufacturing method of a metal bump structure according to an embodiment of the disclosure. Please refer to FIG. 1A for the manufacturing method of the metal bump structure of the present embodiment. First, a driving base 110 is provided. At least one pad (two pads 120 are shown schematically) and an insulating layer 130 have been formed on the driving base 110. The pad 120 is formed on an arrangement surface 112 of the driving base 110 and has an upper surface 122. The insulating layer 130 covers the arrangement surface 112 of the driving base 110 and covers the pad 120, and exposes a part of the upper surface 122 of the pad 120. Here, the driving base 110 is, for example, a thin film transistor (TFT) glass substrate, and the material of the pad 120 is, for example, ITO, or any sputtered metal layer such as titanium, copper, molybdenum, aluminum, or chromium. That is, the pad 120 and a pixel electrode on the driving base 110 are on the same layer, and both are made of ITO.

Figure 1B:
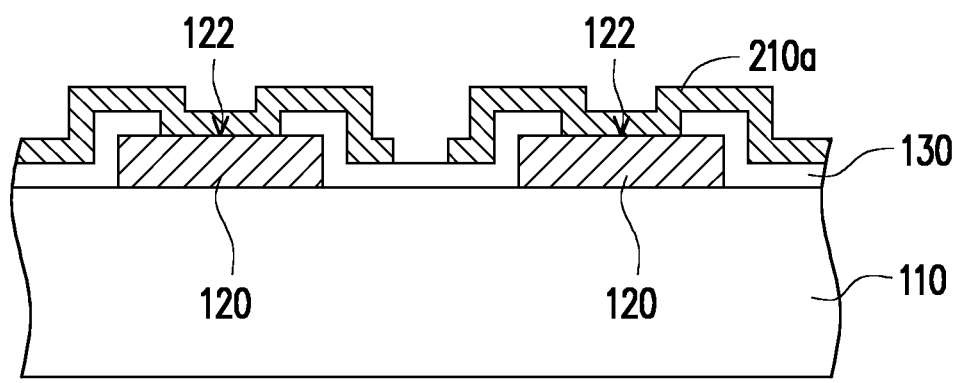
Figure 1C:
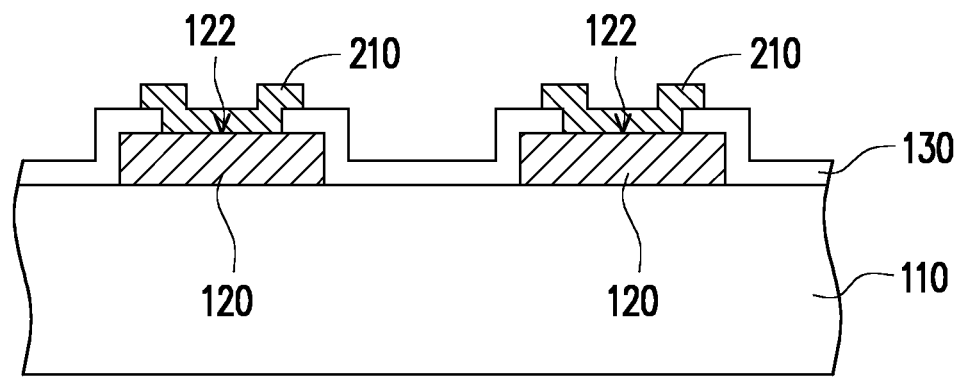

Next, referring to FIG. 1C, a patterned metal layer 210 is formed on the upper surface 122 of the pad 120 exposed by the insulating layer 130, and extends to cover a part of the insulating layer 130. In detail, please refer to FIG. 1B for the steps of forming the patterned metal layer 210. A catalyst layer 210a is formed on the insulating layer 130 and on the upper surface 122 of the pad 120 exposed by the insulating layer 130. A positive projection of the catalyst layer 210a on the driving base 110 is larger than a positive projection of the corresponding pad 120 on the driving base 110. Here, the method for forming the catalyst layer 210a is, for example, an inkjet printing method, and a material of the catalyst layer 210a is, for example, nano-palladium, or any nano metal that may reduce chemical copper, such as nano-gold or nano-silver.

Next, please refer to both FIG. 1B and FIG. 1C. An activation process and a patterning process are performed on the catalyst layer 210a so as to form the patterned metal layer 210. A positive projection of patterned metal layer 210 on the driving base 110 is smaller than a positive projection of the corresponding pad 120 on the driving base 110. Here, the activation process is, for example, a laser activation process or a heating process. If nano-palladium (in an ion state) is used as the catalyst layer 210a, metal palladium can be formed through the activated catalyst layer 210a, and then the patterned metal layer 210 can be formed by patterning the metal palladium. As a result, the material of the patterned metal layer of the present embodiment is embodied as palladium, or any nano metal that may reduce chemical copper, such as gold or silver.

Figure 1D:
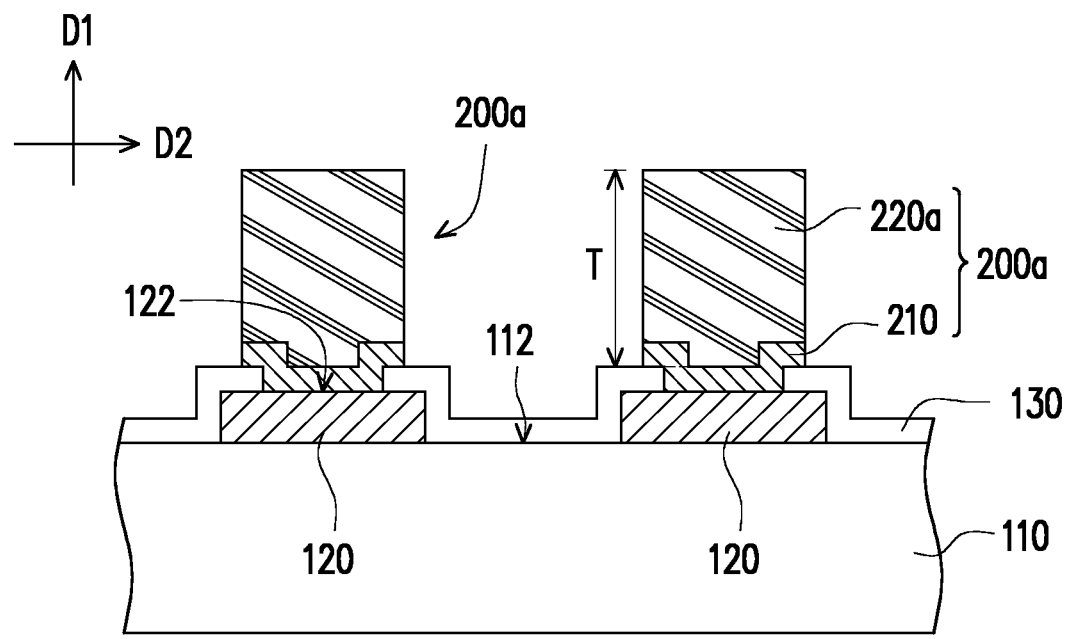

Finally, referring to FIG. 1D, an electro-less process is performed so as to form at least one metal bump (two metal bumps 220a are schematically shown) on the patterned metal layer 210. The electro-less plating process is based on oxidation-reduction reaction, which has a low cost and short production time, in which desired shape is selectively formed according to requirements. A first extension direction D1 of the metal bump 220a is perpendicular to a second extension direction D2 of the driving base 110. Here, a material of the metal bump 220a is, for example, copper, gold, or nickel. A cross-sectional shape of the metal bump 220a is, for example, a rectangular shape, and a thickness T of the metal bump 220a is, for example, between 1 micrometer and 10 micrometers. At this point, the manufacturing of the metal bump structure 200a is completed.

In terms of structure, referring again to FIG. 1D, the metal bump structure 200a is disposed on the driving base 110. A pad 120 and an insulating layer 130 are disposed on the driving base 110. The pad 120 is disposed on the arrangement surface 112 of driving base 110 and has the upper surface 122. The insulating layer 130 covers the arrangement surface 112 of the driving base 110 and covers the pad 120, and exposes a part of the upper surface 122 of the pad 120. The metal bump structure 200a includes the patterned metal layer 210 and metal bump 220a. The patterned metal layer 210 is disposed on the upper surface 122 of the pad 120 exposed by the insulating layer 130, and extends to cover a part of the insulating layer 130, where the material of the patterned metal layer 210 is palladium, for example, or any nano metal that may reduce chemical copper, such as gold or silver. The metal bump 220a is disposed on the patterned metal layer 210, where a first extension direction D1 of the metal bump 220a is perpendicular of second extension direction D2 of the driving base 110. Here, a material of the metal bump 220a is, for example, copper, gold, or nickel, and a cross-sectional shape of the metal bump 220a is, for example, a rectangular shape, and a thickness T of the metal bump 220a is, for example, between 1 micrometer and 10 micrometers.

Since in the present embodiment, the metal bump 220a is formed through the electro-less plating process, compared with the existing wet electroplating process to form metal bumps, the metal bump structure 200a of the present embodiment adopts dry process to form the metal bump 220a, which has simple manufacturing process, low cost, and does not cause environmental pollution.

Note that the reference numerals and some contents of the aforementioned embodiment are used in the following embodiments, where the same numeral is used to represent the same or similar components, and the description of the same technical content is omitted. For the description of omitted contents, please refer to the aforementioned embodiment, which will not be repeated in the following embodiments.

Figure 2:
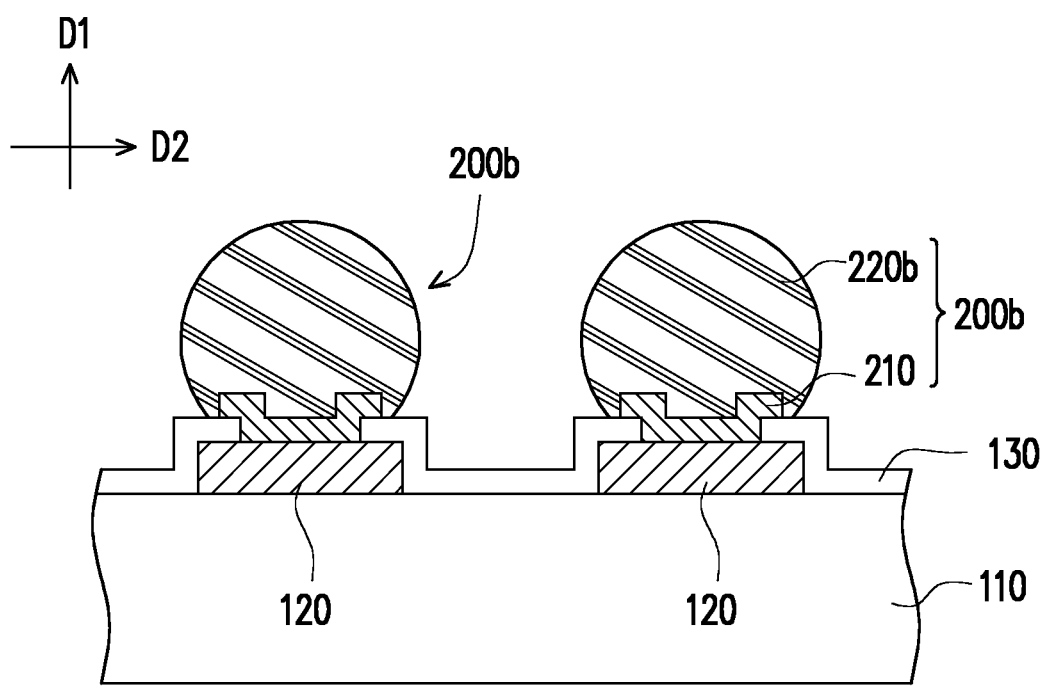
FIG. 2 is a schematic cross-sectional view of a metal bump structure according to another embodiment of the disclosure.

FIG. 2 is a schematic cross-sectional view of a metal bump structure according to another embodiment of the disclosure. Please refer to both FIG. 1D and FIG. 2. The metal bump structure 200b of the present embodiment is similar to the metal bump structure 200a. The difference between the two is: in the present embodiment, a cross-sectional shape of the metal bump 220b of the metal bump structure 200b is embodied as a circle-like shape. In other words, the metal bump structure 200a may be further subjected to a high-temperature reflow process to form a desired shape of the metal bump 220b.

Figure 3A:
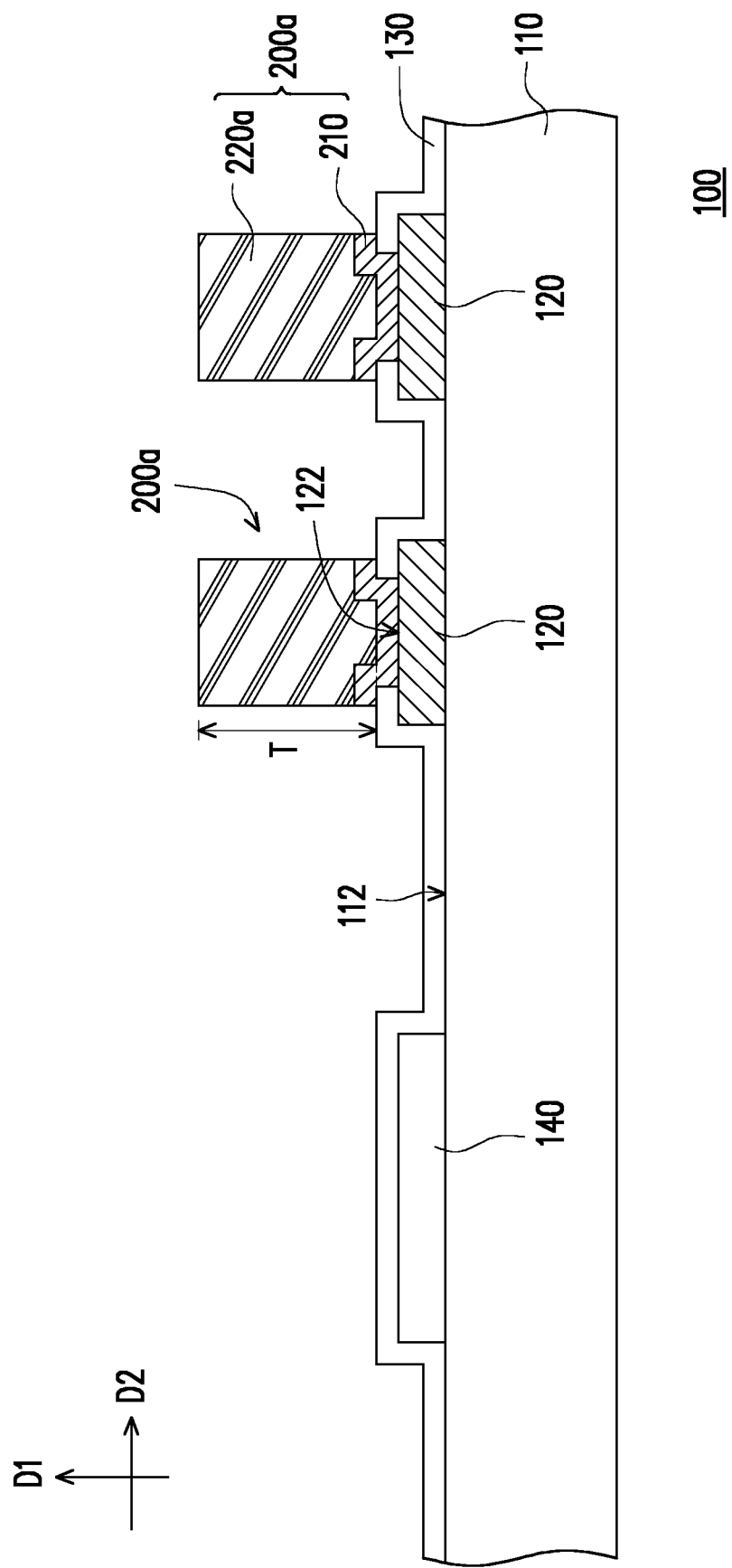
FIG. 3A is a schematic cross-sectional view of a driving substrate according to an embodiment of the disclosure.
Figure 3B:
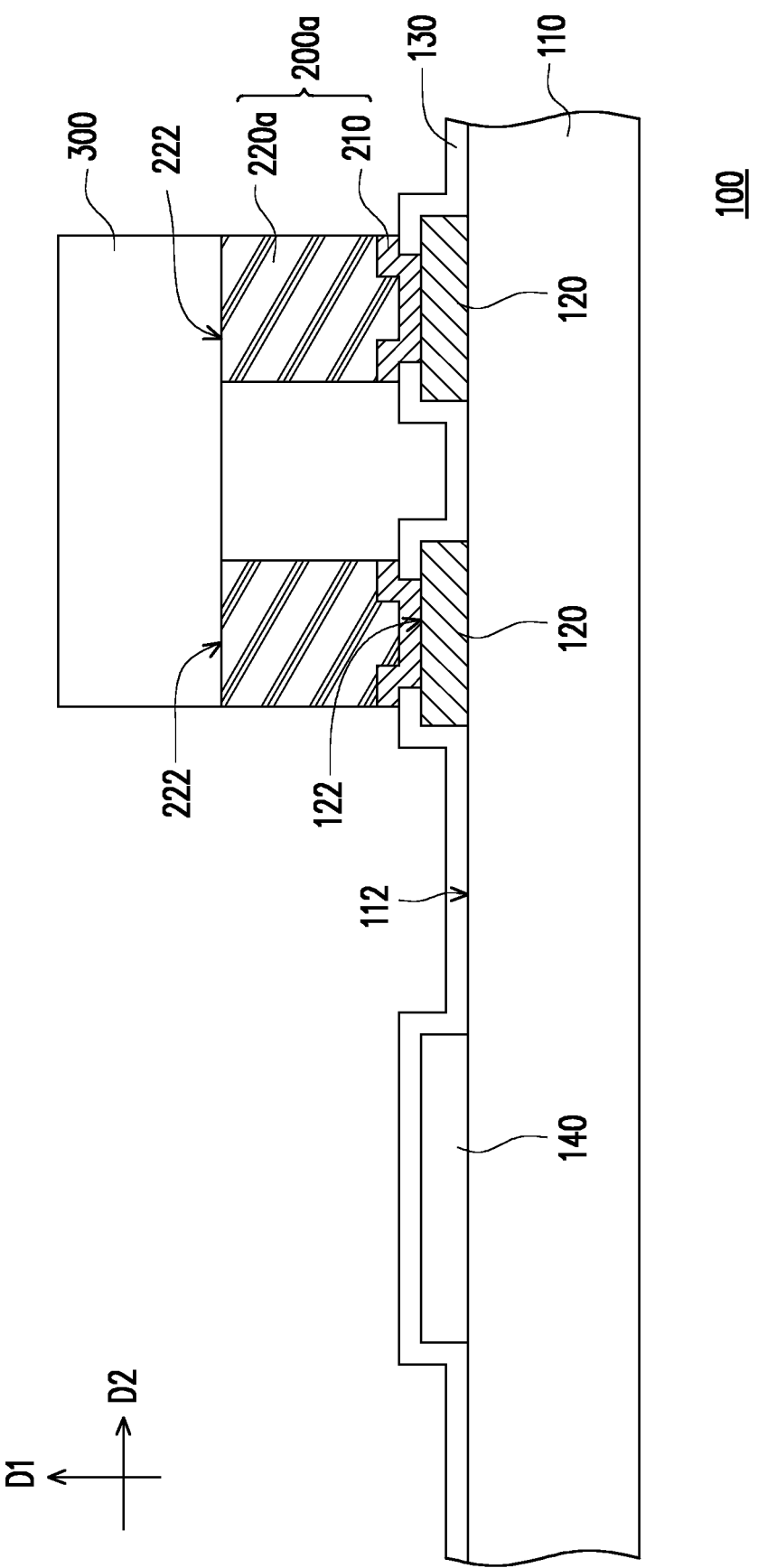
FIG. 3B is a schematic cross-sectional view of a light-emitting element on a driving substrate of FIG. 3A.

FIG. 3A is a schematic cross-sectional view of a driving substrate according to an embodiment of the disclosure. FIG. 3B is a schematic cross-sectional view of disposing a light-emitting element on a driving substrate of FIG. 3A. First please refer to FIG. 3A. In the present embodiment, a driving substrate 100 includes the driving base 110, the at least one pad (two pads 120 are shown schematically), the insulating layer 130, at least one active element (one active element 140 is schematically shown), and the at least one metal bump structure (two metal bump structures 200a are shown schematically). The driving base 110 has the arrangement surface 112, where the driving base 110 is, for example, a thin film transistor (TFF) glass substrate. The active element 140 is disposed on the arrangement surface 112 of the driving base 110. The active element 140 is, for example, a thin film transistor, but the disclosure is not limited thereto. The pad 120 is disposed on the arrangement surface 112 of the driving base 110 and has the upper surface 122. A material of the pad 120 is, for example, ITO, or any sputtered metal layer such as titanium, copper, molybdenum, aluminum, or chromium. That is, the pad 120 and a pixel electrode on the driving base 110 are on the same layer, and both are made of ITO. The insulating layer 130 covers the arrangement surface 112 of the driving base 110, covers the active element 140, and covers the pad 120, and the insulating layer 130 exposes a part of the upper surface 122 of the pad 120. The metal bump structure 200a includes the patterned metal layer 210 and metal bump 220a. The patterned metal layer 210 is disposed on the upper surface 122 of the pad 120 exposed by the insulating layer 130, and extends to cover a part of the insulating layer 130. The metal bump 220a is disposed on the patterned metal layer 210. A first extension direction D1 of the metal bump 220a is perpendicular to second extension direction D2 of the driving base 110.

With reference to FIG. 3B, a light-emitting element 300 is disposed on the driving substrate 100 to so as form a display with the driving substrate 100, where the light-emitting element 300 is disposed on the metal bump 220a of the metal bump structure 200a. Furthermore, the light-emitting element 300 is, for example, a micro LED, where each light-emitting element 300 is bonded to two metal bump structures 200a of the driving substrate 100 by flip-chip bonding. The light-emitting element 300 is structurally and electrically connected to an upper surface 222 of the metal bump 220a, and is electrically connected to the pad 120 through the metal bump 220a and the patterned metal layer 210. Since the metal bump 220a with a certain thickness is formed by electro-less plating process in the present embodiment, when the light-emitting element 300 and the metal bump structure 200a are solder-bonded, a good intermetallic compound may be formed between the light-emitting element 300 and the metal bump structure 200a, such that better structure reliability can be achieved.

Based on the above, according to the manufacturing method of the metal bump structure of the disclosure, the metal bump is formed through an electro-less plating process. Compared with the existing wet electroplating process to form metal bumps, dry process is adopted in the disclosure to form metal bumps, which has the simple manufacturing process, low cost, and does not cause environmental pollution. In addition, with the driving substrate of the metal bump structure of the disclosure, when the light-emitting element is subsequently bonded, good intermetallic compound interface can be formed between the light-emitting element and the metal bump structure, which has better structural reliability.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:
1. A manufacturing method of a metal bump structure, comprising:
    providing a driving base, on which at least one pad and an insulating layer already formed, wherein the at least one pad is formed on an arrangement surface of the driving base and has an upper surface, wherein the insulating layer covers the arrangement surface of the driving base and covers the at least one pad, and exposes a part of the upper surface of the at least one pad, wherein a material of the at least one pad comprises ITO, and the at least one pad and a pixel electrode on the driving base are on the same layer;
    forming a patterned metal layer on the upper surface of the at least one pad exposed by the insulating layer, wherein the patterned metal layer extends to cover a part of the insulating layer; and
    performing an electro-less plating process so as to form at least one metal bump on the patterned metal layer, wherein a first extension direction of the at least one metal bump is perpendicular to a second extension direction of the driving base.

2. The manufacturing method of the metal bump structure as described in claim 1, wherein the steps of forming the patterned metal layer comprise:
   forming a catalyst layer on the insulating layer and on the upper surface of the at least one pad exposed by the insulating layer; and
   performing an activation process and a patterning process on the catalyst layer so as to form the patterned metal layer.

3. The manufacturing method of the metal bump structure as described in claim 2, wherein a method of forming the catalyst layer comprises an inkjet printing method.

4. The manufacturing method of the metal bump structure as described in claim 2, wherein a material of the catalyst layer comprises nano-palladium, nano-gold or nano-silver.

5. The manufacturing method of the metal bump structure as described in claim 2, wherein the activation process comprises a laser activation process or a heating process.

6. The manufacturing method of the metal bump structure as described in claim 1, wherein a material of the patterned metal layer comprises palladium, gold or silver.

7. The manufacturing method of the metal bump structure as described in claim 1, wherein a material of the metal bump comprises copper, gold, tin or nickel.

8. The manufacturing method of the metal bump structure as described in claim 1, wherein a cross-sectional shape of the metal bump comprises a circle-like shape or a rectangular shape.

9. The manufacturing method of the metal bump structure as described in claim 1, wherein a material of the at least one pad comprises ITO, titanium, copper, molybdenum, aluminum or chromium.

10. The manufacturing method of the metal bump structure as described in claim 1, wherein a thickness of the metal bump is between 1 micrometer and 10 micrometers.

11. A driving substrate, comprising:
    a driving base, comprising an arrangement surface, wherein the driving base is a thin film transistor glass substrate;
    at least one active element, disposed on the arrangement surface of the driving base;
    at least one pad, disposed on the arrangement surface of the driving base and has an upper surface, wherein a material of the at least one pad comprises ITO, and the at least one pad and a pixel electrode on the driving base are on the same layer;
    an insulating layer, covering the arrangement surface of the driving base, covering the at least one active device, and covering the at least one pad, and the insulating layer exposing a part of the upper surface of the at least one pad; and
    at least one metal bump structure, comprising:
       a patterned metal layer, disposed on the upper surface of the at least one pad exposed by the insulating layer and extending to cover a part of the insulating layer; and
       a metal bump, disposed on the patterned metal layer, wherein a first extension direction of the metal bump is perpendicular to a second extension direction of the driving base.

12. The driving substrate as described in claim 11, wherein a material of the patterned metal layer comprises palladium, and a material of the metal bump comprises copper, gold, tin or nickel.

13. The driving substrate as described in claim 11, wherein a cross-sectional shape of the metal bump comprises a circle-like shape or a rectangular shape.

14. The driving substrate as described in claim 11, wherein a thickness of the metal bump is between 1 micrometer and 10 micrometers.

* * * * *